United States Patent
Chung

(10) Patent No.: US 8,890,586 B2
(45) Date of Patent: Nov. 18, 2014

(54) SAWTOOTH WAVE GENERATING CIRCUIT AND SWITCH MODE POWER SUPPLY DEVICE HAVING THE SAME

(75) Inventor: Kyu-Young Chung, Seoul (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 1549 days.

(21) Appl. No.: 12/489,877

(22) Filed: Jun. 23, 2009

(65) Prior Publication Data

US 2009/0315529 A1  Dec. 24, 2009

(30) Foreign Application Priority Data

Jun. 23, 2008 (KR) .................. 10-2008-0059124

(51) Int. Cl.
  *H03K 4/06* (2006.01)
  *H03K 4/50* (2006.01)
(52) U.S. Cl.
  CPC ........................ *H03K 4/50* (2013.01)
  USPC .................. 327/131; 327/135; 327/137
(58) Field of Classification Search
  USPC ................. 327/131, 132, 134, 135, 137, 140
  See application file for complete search history.

(56) References Cited

U.S. PATENT DOCUMENTS

| 4,292,654 | A | 9/1981 | Steckler et al. |
| 4,598,259 | A | 7/1986 | Gontowski, Jr. |
| 6,169,433 | B1 * | 1/2001 | Farrenkopf .................... 327/131 |
| 7,339,406 | B2 * | 3/2008 | Takeuchi ...................... 327/134 |
| 7,746,129 | B2 * | 6/2010 | Choi et al. .................... 327/131 |

FOREIGN PATENT DOCUMENTS

| CN | 1711685 | 12/2005 |
| KR | 20070044536 | 4/2007 |

OTHER PUBLICATIONS

The Study of PWM IC Design for SMPS—In-Chul Choi et al.—Department of Electronics, Seokyeong University—pp. 557-560.
Chinese Office Action dated Feb. 16, 2013 issued in CN Application No. 200910163945.4.

* cited by examiner

*Primary Examiner* — Long Nguyen
(74) *Attorney, Agent, or Firm* — Ellsworth IP Group PLLC

(57) ABSTRACT

A sawtooth wave generating circuit that outputs a sawtooth wave signal after calibration and a switch mode power supply device including the sawtooth wave generating circuit is disclosed. The sawtooth wave generating circuit includes a capacitor, a calibration circuit, a charging circuit, discharging circuit and a control unit. The calibration circuit feedbacks a sawtooth wave signal, generates a plurality of voltage signals based on the sawtooth wave signal, and selects one of the voltage signals to generate a calibration output signal. Therefore, the sawtooth wave generating circuit generates a stable sawtooth wave signal regardless of operating conditions.

8 Claims, 12 Drawing Sheets

SAWTOOTH WAVE GENERATING CIRCUIT AND SWITCH MODE POWER SUPPLY DEVICE HAVING THE SAME

CROSS-REFERENCE TO RELATED APPLICATIONS

This application claims priority under 35 U.S.C §119 from Korean Patent Application No. 2008-59124, filed on Jun. 23, 2008 in the Korean Intellectual Property Office (KIPO), the disclosure of which is incorporated herein in its entirety by reference.

BACKGROUND

1. Field of the General Inventive Concept

The embodiments relate to a sawtooth wave generating circuit, and more particularly to a switch mode power supply device having the sawtooth wave generating circuit.

2. Description of the Related Art

Generally, a power supply device that supplies a power source is required to operate electronic devices. Recently a switch mode power supply (SMPS) device that supplies a stable DC output voltage is used in electronic devices.

The SMPS device converts a DC input voltage into stable output voltages that have various values by controlling a current through an inductor, using semiconductor devices as switching devices. The SMPS device has high power conversion efficiency, small size and light weight compared with a conventional linear power supply device because the SMPS device controls the switching of the semiconductor devices.

The SMPS device compares a feedback signal that is proportional to an output signal of the SMPS device and a sawtooth wave to generate a pulse-width modulated (PWM) clock signal. A sawtooth wave generating circuit included in the SMPS device generates a sawtooth signal in the process of charging and discharging a capacitor.

Conventionally, the slope of a sawtooth wave signal that is generated by a sawtooth wave generating circuit has been determined by charging current and capacitance of a capacitor, and the slope of the sawtooth has been designed to have a fixed value.

However, the charging current and the capacitance of the capacitor may be changed according to an operating condition such as a fabrication process, an operating voltage and an operating temperature. Further, a parasitic capacitance that is in the sawtooth wave generating circuit may be changed according to different operating conditions such as the fabrication process, the operating voltage and the operating temperature. Therefore, conventionally it was difficult to generate a sawtooth wave signal having a desired slope.

If the slope of a sawtooth wave signal is fixed, a waveform of the sawtooth wave signal may be distorted when a frequency of the sawtooth wave signal is very large, and amplitude of the sawtooth wave signal may be too small when a frequency of the sawtooth wave signal is very small.

SUMMARY

The present general inventive concept provides a sawtooth wave generating circuit that outputs a sawtooth wave signal after performing calibration.

The present general inventive concept also provides a DC-DC converter having the sawtooth wave generating circuit.

The present general inventive concept also provides a switch mode power supply device having the sawtooth wave generating circuit.

Additional aspects and utilities of the present general inventive concept will be set forth in part in the description which follows and, in part, will be obvious from the description, or may be learned by practice of the general inventive concept.

The foregoing and/or other aspects and utilities of the present general inventive concept may be achieved by providing a sawtooth wave generating circuit including a capacitor, a calibration circuit, a charging circuit and a discharging circuit. The sawtooth wave generating circuit including a capacitor is coupled between a first node and a ground, a calibration circuit receives a sawtooth wave signal that is fed back from the first node, generates a plurality of voltage signals based on the sawtooth wave signal, and selects one of the voltage signals to generate a calibration output signal, the charging circuit charges the capacitor in response to the calibration output signal, and the discharging circuit discharges the capacitor in response to a short pulse signal.

The calibration circuit may perform calibration based on the fed-back the sawtooth wave signal in a calibration mode, and operate in a normal mode when the sawtooth wave signal approaches a set reference voltage.

The calibration circuit may include a feedback circuit, a counter, a decoder and a multiplexer. The feedback circuit may compare the sawtooth wave signal with a first reference voltage to generate a counter enable signal, the counter may generate a digital code having N bits in response to the counter enable signal, the decoder may decode the digital code having the N bits to generate the voltage signals, and the multiplexer may select one of the voltage signals to generate the calibration output signal.

The feedback circuit may include a comparator and an AND gate. The comparator may compare the sawtooth wave signal with the first reference voltage to generate a flag signal and the AND gate performs a logical AND operation on the flag signal and a calibration enable signal to generate the counter enable signal.

The feedback circuit may include a comparator, a noise canceller and an AND gate. The comparator may compare the sawtooth wave signal with the first reference voltage to generate a flag signal, a noise canceller cancels noise included in the flag signal, and an AND gate performs a logical AND operation on an output signal of the noise canceller and a calibration enable signal to generate the counter enable signal.

The feedback circuit may include a comparator, a D-type flip-flop, an inverter and an AND gate. The comparator may compare the sawtooth wave signal with the first reference voltage to generate a flag signal, the D-type flip-flop outputs a signal having a logical high state in response to the flag signal, the inverter inverts a phase of an output signal of the D-type flip-flop, and an AND gate performs a logical AND operation on an output signal of the inverter and a calibration enable signal to generate the counter enable signal.

The feedback circuit may include a comparator, a noise canceller, a D-type flip-flop, an inverter and an AND gate. The comparator may compare the sawtooth wave signal with the first reference voltage to generate a flag signal, a noise canceller cancels noise included in the flag signal, a D-type flip-flop a signal having a logical high state in response to an output signal of the noise canceller, a inverter inverts a phase of an output signal of the D-type flip-flop, and an AND gate performs a logical AND operation on an output signal of the inverter and a calibration enable signal to generate the counter enable signal.

The charging circuit may include an amplifier, a current supplying circuit and a resistor. The amplifier may amplify the calibration output signal, a current supplying circuit may supply a charging current in response to an output signal of the amplifier, and a resistor may maintain the charging current.

The discharging circuit may include a transistor that discharges the first node to a logic low state.

The foregoing and/or other aspects and utilities of the present general inventive concept may also be achieved by providing a DC-DC converter that may include a sawtooth wave generating circuit and a power converting circuit. The sawtooth wave generating circuit generates a sawtooth wave signal, performs a calibration based on the sawtooth wave signal that is fed back in a calibration mode, and operates in a normal mode when the sawtooth wave signal reaches a first reference voltage, a power converting circuit generates a switch control signal, changes an inductor current in response to the switch control signal, and converts a DC input voltage into a stable DC output voltage.

The power converting circuit may include a DC voltage source, a switch driving circuit, an inductor, and a power device. The DC voltage source may generate the DC input voltage, a switch driving circuit may generate the switch control signal based on the sawtooth wave signal and a first sensing voltage, an inductor is coupled between a first terminal of the DC voltage source and a first node, and a power device is coupled between the first node and a ground and operates in response to the switch control signal.

The power converting circuit may further include a current sensing circuit that senses a current flowing through the power device to generate a second sensing voltage.

The switch driving circuit may include an error amplifier and a comparator. The error amplifier may amplify a difference between the first sensing voltage and a second reference voltage and a comparator compares an output signal of the error amplifier and the sawtooth wave signal to generate the switch control signal.

The switch driving circuit may further include a frequency compensating circuit that performs frequency compensation on an output signal of the error amplifier.

The switch driving circuit may include an error amplifier, a switch and a comparator. The error amplifier may amplify a difference between the first sensing voltage and a second reference voltage, a switch may provide an output signal of the error amplifier or the first reference voltage to a second node in response to a calibration enable signal, and a comparator compares a voltage signal of the second node and the sawtooth wave signal to generate the switch control signal or a flag signal.

The switch driving circuit may compare the first reference voltage and the sawtooth wave signal to generate the flag signal in a calibration mode, and compare an output signal of the error amplifier and the sawtooth wave signal to generate the switch control signal in a normal mode.

The flag signal may be used to calibrate the sawtooth wave signal in the sawtooth wave generating circuit.

The switch driving circuit may further include a frequency compensating circuit configured to perform frequency compensation on an output signal of the error amplifier.

The power converting circuit may further include a diode, a capacitor and a voltage divider. The diode may be coupled between the first node and an output node, a capacitor may be coupled between the output node and the ground, and charge the DC output voltage, and a voltage divider divides a voltage of the output node to generate the first sensing voltage.

The foregoing and/or other aspects and utilities of the present general inventive concept may also be achieved by providing a switch mode power supply device including an AC-DC converter, a sawtooth wave generating circuit and a power converting circuit, an AC-DC converter may convert an AC input voltage into a DC input voltage, a sawtooth wave generating circuit may perform a calibration based on a sawtooth wave signal that is fed back, and may operate in a normal mode when the sawtooth wave signal reaches a set reference voltage, a power converting circuit may generate a switch control signal using an output signal of the sawtooth wave generating circuit, may change an inductor current in response to the switch control signal, and may convert the DC input voltage into a stable DC output voltage.

The foregoing and/or other aspects and utilities of the present general inventive concept may also be achieved by providing a calibration circuit to generate a calibration output signal, and a charging circuit to generate a charging current as a sawtooth wave signal in response to the calibration output signal, wherein the calibration circuit modifies the calibration output signal in response to a short pulse, the sawtooth wave signal, a reference voltage, and an enable signal, to generate the modified calibration output signal as the calibration output signal.

A power converting circuit may generate a switch control signal according to the charging current and convert a DC-DC input voltage into a stable DC-DC output voltage.

Therefore, the sawtooth wave generating circuit according to the embodiments may determine an optimum charging current for a fabrication process, an operating voltage, or an operating temperature because the sawtooth wave generating circuit performs calibration on a sawtooth wave signal. Therefore, the sawtooth wave generating circuit according to the embodiments may generate a stable sawtooth wave signal even though a frequency, a fabrication process, an operating voltage, or an operating temperature may be changed. The DC-DC converter or the switch mode power supply device including the sawtooth wave generating circuit may generate a switch control signal that drives a power device using a calibrated sawtooth wave signal. Therefore, the switch mode power supply device including the sawtooth wave generating circuit according to the embodiments may generate a stable switch control signal and a stable DC output voltage even though a frequency, a fabrication process, an operating voltage, or an operating temperature may be changed.

BRIEF DESCRIPTION OF THE DRAWINGS

These and/or other features and utilities of the present general inventive concept will become apparent and more readily appreciated from the following description of the embodiments, taken in conjunction with the accompanying drawings of which.

DETAILED DESCRIPTION OF THE EMBODIMENTS

Figure 1:
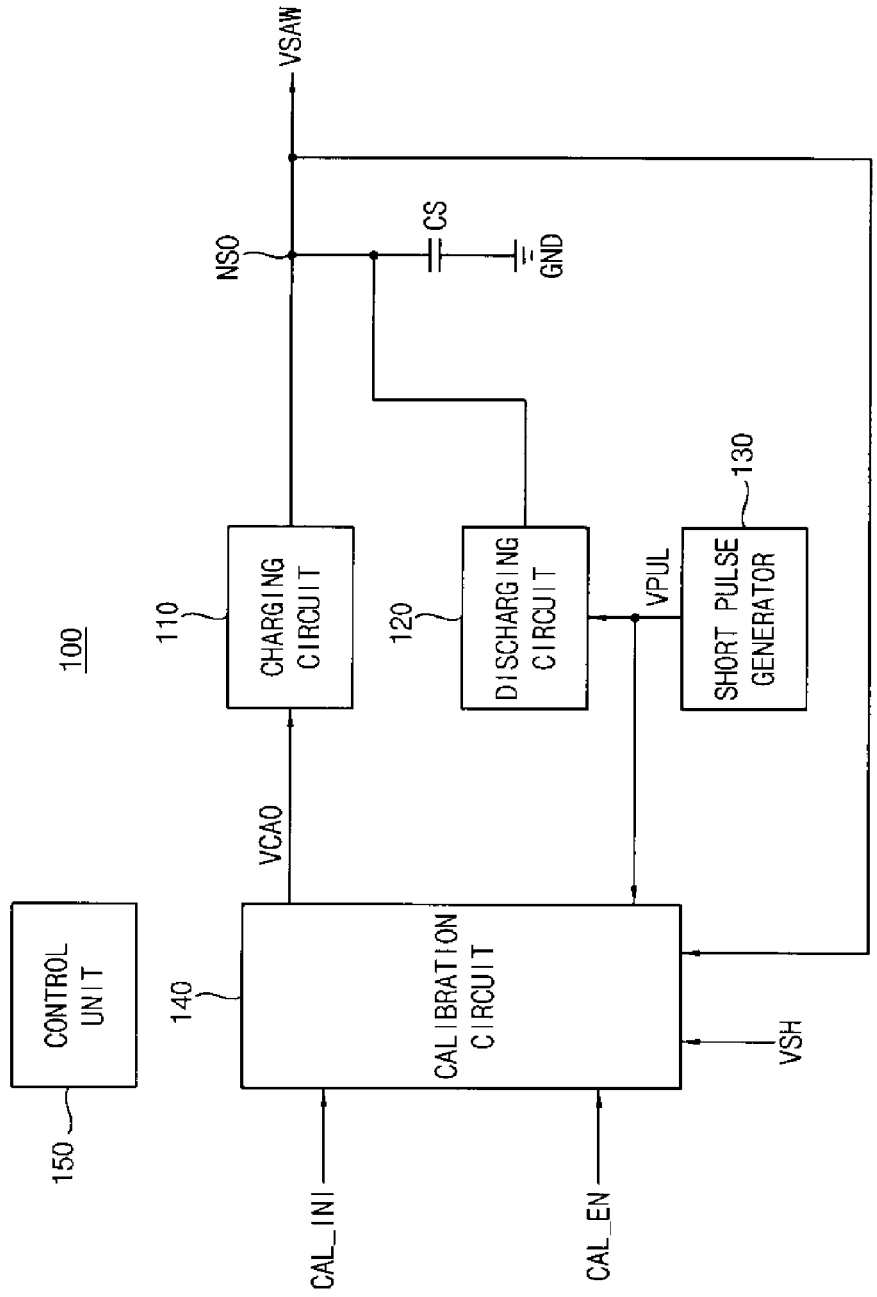
FIG. 1 is a diagram illustrating a sawtooth wave generating circuit according to an example embodiment of the present general inventive concept.

Embodiments of the present general inventive concept now will be described more fully with reference to the accompanying drawings, in which embodiments of the present general inventive concept are illustrated. This general inventive concept may, however, be embodied in many different forms and should not be construed as limited to the embodiments set forth herein. Rather, these embodiments are provided so that this disclosure will be thorough and complete, and will fully convey the scope of the present general inventive concept to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present general inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the present general inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this present general inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a diagram illustrating a sawtooth wave generating circuit according to an example embodiment.

Referring to FIG. 1, the sawtooth wave generating circuit 100 includes a capacitor CS, a calibration circuit 140, a charging circuit 110, a discharging circuit 120, and a control unit 150.

The capacitor CS is coupled between a first node NSO and a ground GND. The calibration circuit 140 receives a sawtooth wave signal VSAW that is fed back from the first node NSO, generates a plurality of voltage signals (not illustrated) based on the sawtooth wave signal VSAW, and selects one of the voltage signals to generate a calibration output signal VCAO. Further, as described hereinafter, the calibration circuit 140 may be initialized by a calibration initializing signal CAL_INI and activated by a calibration enable signal CAL_EN. Further, the calibration circuit 140 may compare the sawtooth wave signal VSAW with a first reference voltage VSH from the control unit 150 to generate a flag signal. The charging circuit 110 may charge the capacitor CS in response to the calibration output signal VCAO, and the discharging circuit 120 may discharge the capacitor CS in response to a short pulse signal VPUL. The charging circuit 110 may produce and output the sawtooth wave signal VSAW.

The operations and functions of the sawtooth wave generating unit 100, DC-DC converter and switch mode power supply described later, may be controlled by the control unit 150. The control unit 150 may be a part of a larger circuit apparatus of which the embodiments described herein combine. The control unit 150 may be a signal processor such a DSP, a microprocessor, or a combination of logic circuits that control the apparatuses of the present general inventive concept described herein.

Further, the sawtooth wave generating circuit 100 may include a short pulse generator 130 that generates the short pulse signal VPUL.

The sawtooth wave generating circuit 100 of FIG. 1 includes the calibration circuit 140, which may receive feedback including the sawtooth wave signal VSAW, and performs calibration until a peak value of the sawtooth wave signal VSAW reaches the level of a first reference voltage VSH in a calibration mode. A charging current when the sawtooth wave signal VSAW reaches the first reference voltage level VSH is the charging current of the sawtooth wave generating circuit 100 that is used when a switch mode power supply (SMPS) device operates in a normal mode. A digital code corresponding to the charging current determined through the calibration process may be stored in a register (not illustrated) in the calibration circuit 140, and the digital code may be used when the SMPS device operates.

The sawtooth wave generating circuit 100 of FIG. 1 performs calibration through a feedback process before an external device such as SMPS device uses the sawtooth wave signal VSAW. Therefore, even though a frequency, a fabrication process, an operating voltage, or an operating temperature may be later changed in an SMPS device, the sawtooth wave generating circuit 100 may set an optimum charging current, and generate a stable sawtooth wave signal VSAW before being used in the SMPS device. The calibration circuit 140 may be initialized by a calibration initializing signal CAL_INI from the control unit 150 and activated by a calibration enable signal CAL_EN. Therefore, the sawtooth wave generating circuit 100 may be deactivated in the normal mode, and generate a charging current corresponding to a digital code when the calibration is completed, and output a calibrated sawtooth wave signal VSAW.

Figure 2:
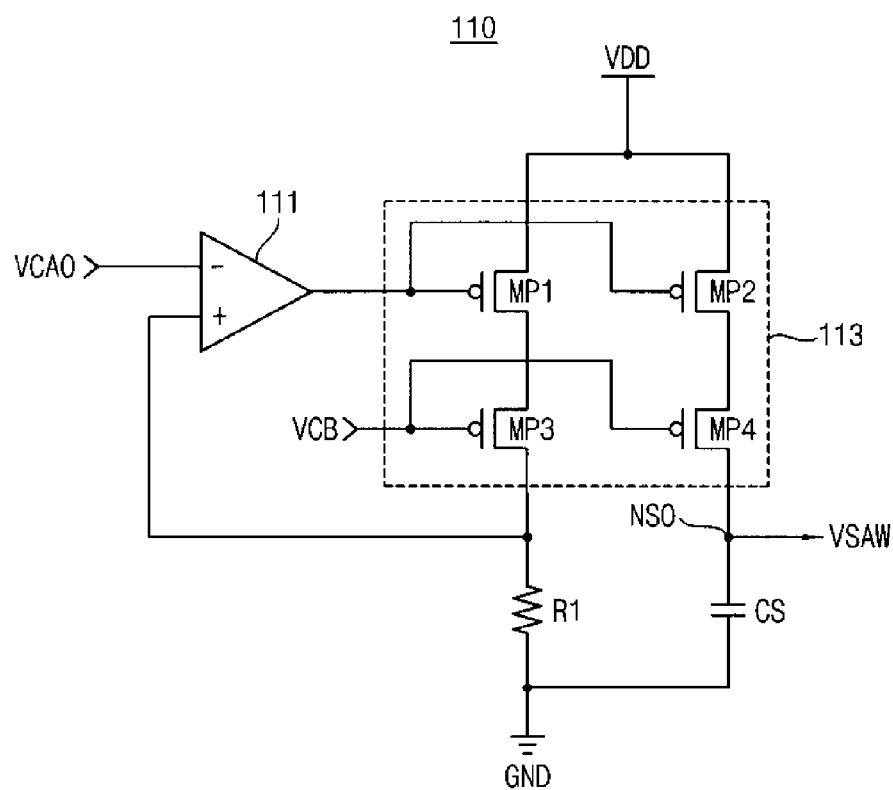
FIG. 2 is a circuit diagram illustrating an example of a charging circuit included in the sawtooth wave generating circuit of FIG. 1 according to an embodiment of the present general inventive concept.

FIG. 2 is a circuit diagram illustrating an example of a charging circuit 110 included in the sawtooth wave generating circuit 100 of FIG. 1.

Referring to FIG. 2, the charging circuit 110 includes an amplifier 111, a current supplying circuit 113 and a resistor R1.

The amplifier 111 has an inverting input terminal to which the calibration output signal VCAO is applied and a non-inverting input terminal connected to a first terminal of the resistor R1, and amplifies the calibration output signal VCAO. An output terminal of the amplifier 111 is coupled to the current supplying circuit 113. A second terminal of the resistor R1 is connected to the ground GND. The current supplying circuit 113 supplies a charging current to the capacitor CS in response to an output signal of the amplifier 111. In the charging circuit 110 of FIG. 2, the capacitor CS is the same as the capacitor CS illustrated in FIG. 1. The resistor R1 maintains the charging current. The amplifier 111 may be an operational amplifier having high input resistance.

The current supplying circuit 113 includes a first PMOS transistor MP1, a second PMOS transistor MP2, a third PMOS transistor MP3, and a fourth PMOS transistor MP4. The current supplying circuit 113 may be a cascade-type current mirror that operates as an ideal current source due to high output resistance thereof.

Each of the first PMOS transistor MP1 and the second PMOS transistor MP2 have a gate connected to an output terminal of the amplifier 111 and a source to which a supply voltage VDD is applied. The third PMOS transistor MP3 has a gate to which a cascade bias VCB is applied, a source connected to the drain of the first PMOS transistor MP1, and a drain connected to a first terminal of the resistor R1. The fourth PMOS transistor MP4 has a gate to which the cascade bias VCB is applied, a source connected to the drain of the second PMOS transistor MP1, and a drain connected to a first terminal of the capacitor CS. The sawtooth wave signal VSAW is output from the first terminal of the capacitor CS, and a second terminal of the capacitor CS is connected to the ground GND.

In FIG. 2, the charging current is determined by the calibration output signal VCAO divided by R1 (VCAO/R1), and the charging current is supplied to the capacitor CS through the current supplying circuit 113.

Figure 3:
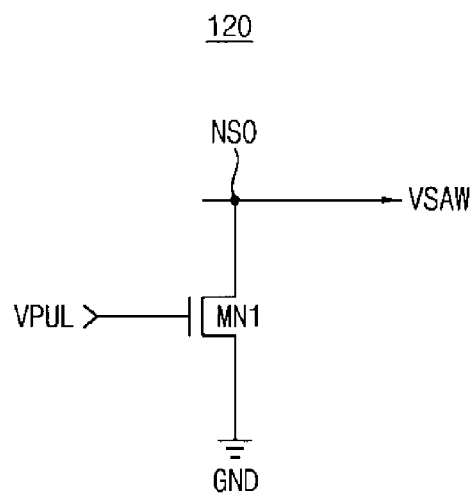
FIG. 3 is a circuit diagram illustrating an example of a discharging circuit included in the sawtooth wave generating circuit of FIG. 1 according to an embodiment of the present general inventive concept.

FIG. 3 is a circuit diagram illustrating an example of a discharging circuit 120 included in the sawtooth wave generating circuit 100 of FIG. 1.

Referring to FIG. 3, the discharging circuit 120 is coupled between the first node NSO and the ground GND, and includes a first NMOS transistor MN1 which performs a switching operation in response to the short pulse signal VPUL. When the short pulse signal VPUL is a logic "high" state, the first NMOS transistor MN1 is turned on and the capacitor CS connected to the first node NSO (illustrated in FIG. 1) is discharged.

Figure 4:
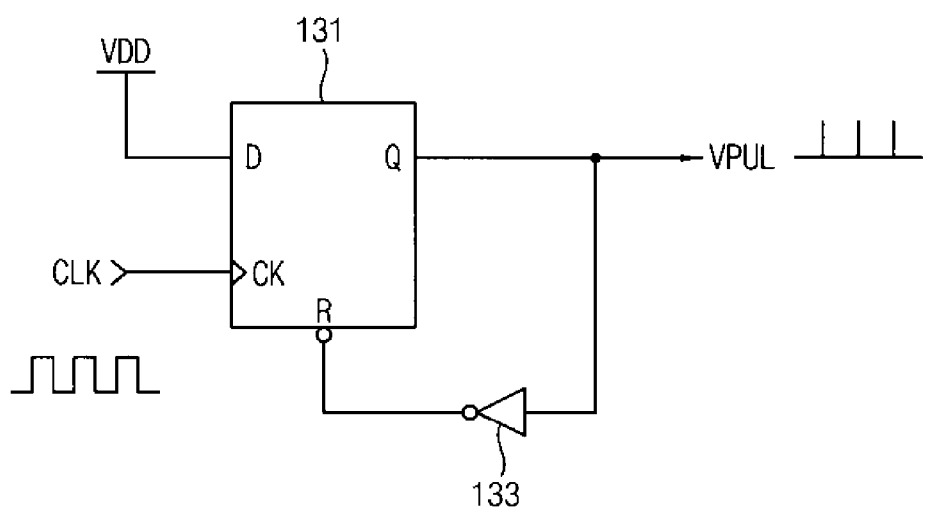
FIG. 4 is a circuit diagram illustrating an example of a short pulse generator included in the sawtooth wave generating circuit of FIG. 1 according to an embodiment of the present general inventive concept.

FIG. 4 is a circuit diagram illustrating an example of a short pulse generator 130 included in the sawtooth wave generating circuit 100 of FIG. 1.

Referring to FIG. 4, the short pulse generator 130 includes a D-type flip-flop 131 and an inverter 133.

The D-type flip-flop 131 outputs through the output terminal Q a signal having a logic "high" state in response to a clock signal CLK and voltage source VDD. The inverter 133 inverts a phase of an output signal of the D-type flip-flop 131 and applies the inverted signal to a reset terminal R of the D-type flip-flop 131.

The short pulse generator 130 generates the short pulse signal VPUL at a rising edge of the clock signal CLK that has a predetermined pulse width. The short pulse signal VPUL is fed back to the reset terminal R of the D-type flip-flop 131, and changes the output of the D-type flip-flop 131 into a logic "low" state. Therefore, the short pulse signal VPUL becomes a pulse signal having a short pulse width as illustrated in FIG. 4.

Figure 5:
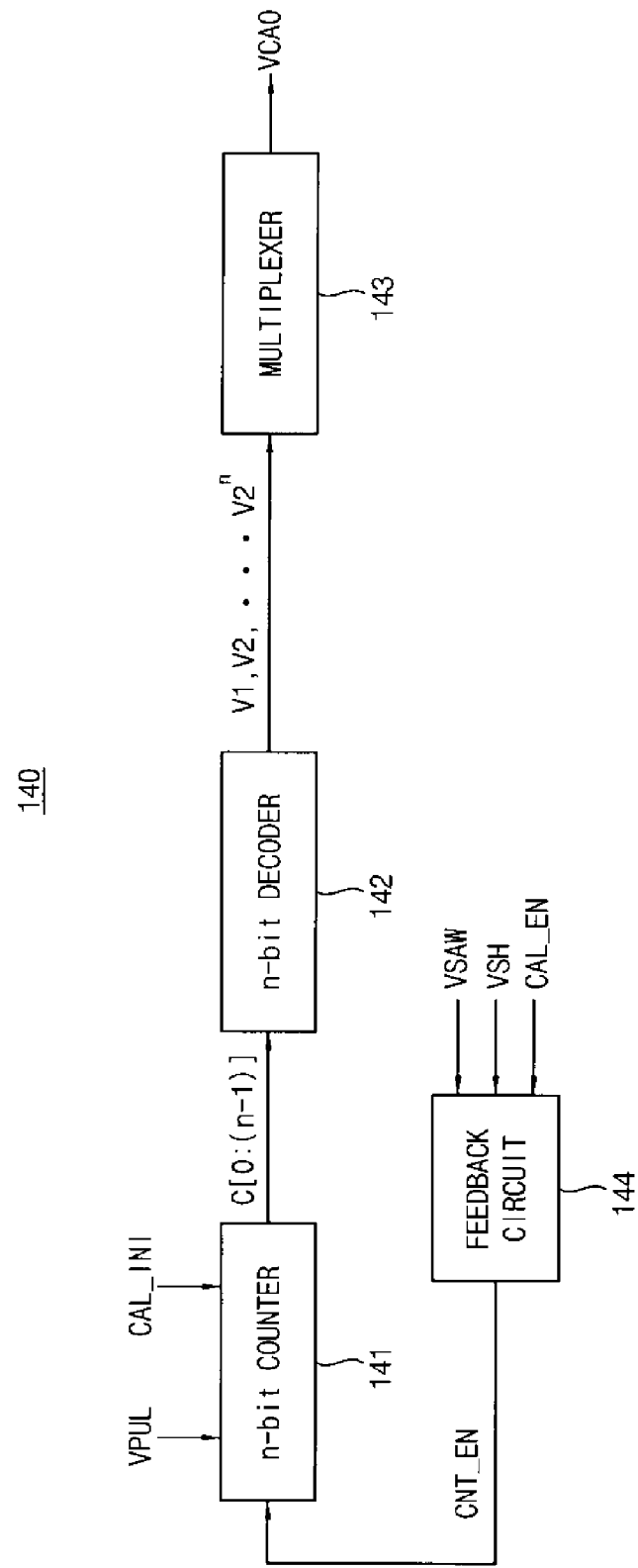
FIG. 5 is a circuit diagram illustrating an example of a calibration circuit included in the sawtooth wave generating circuit of FIG. 1 according to an embodiment of the present general inventive concept.

FIG. 5 is a circuit diagram illustrating an example of a calibration circuit 140 included in the sawtooth wave generating circuit 100 of FIG. 1.

Referring to FIG. 5, the calibration circuit 140 includes a counter 141, a decoder 142, a multiplexer 143 and a feedback circuit 144.

The feedback circuit 144 compares the sawtooth wave signal VSAW with a first reference voltage VSH to generate a counter enable signal CNT_EN. Further, the feedback circuit 144 may be activated in response to a calibration enable signal CAL_EN from the control unit 150. The counter 141 generates a digital code C[0:(n-1)] having n bits in response to the counter enable signal CNT_EN and the short pulse signal VPUL. Further, the counter 141 may be initialized by a calibration initializing signal CAL_INI. The decoder 142 decodes the digital code C[0:(n-1)] having n bits to generate the voltage signals V1, V2, . . . , V2n. The multiplexer 143 selects one of the voltage signals V1, V2, . . . , V2n to generate the calibration output signal VCAO.

The calibration circuit 140 of FIG. 1 receives the sawtooth wave signal VSAW that is fed back, compares the sawtooth wave signal VSAW with the first reference voltage VSH to generate the counter enable signal CNT_EN, and generates the digital code C[0:(n-1)] having n bits in response to the counter enable signal CNT_EN. Further, the calibration circuit 140 decodes the digital code C[0:(n-1)] having n bits to generate the voltage signals V1, V2, . . . , V2n, and selects one of the voltage signals V1, V2, . . . , V2n to generate the calibration output signal VCAO. The calibration circuit 140 is initialized by the calibration initializing signal CAL_INI, and activated by the calibration enable signal CAL_EN.

FIGS. 6-9 are circuit diagrams illustrating examples of feedback circuits 144a, 144b, 144c, and 144d that may be used as the feedback circuit 144 illustrated in FIG. 5

Figure 6:
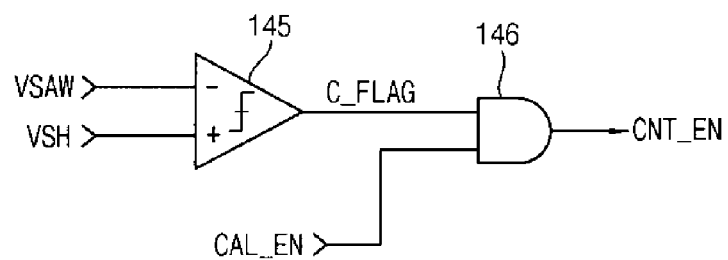
FIG. 6 is a circuit diagram illustrating an example of a feedback circuit included in the calibration circuit of FIG. 5 according to an embodiment of the present general inventive concept.

FIG. 6 is a circuit diagram illustrating an example of a feedback circuit 144a that may be included in the calibration circuit 140 of FIG. 5.

Referring to FIG. 6, the feedback circuit 144a includes a comparator 145 and an AND gate 146.

The comparator 145 compares the sawtooth wave signal VSAW with the first reference voltage VSH to generate a flag signal C_FLAG. The AND gate 146 performs a logical AND operation on the flag signal C_FLAG and the calibration enable signal CAL_EN to generate the counter enable signal CNT_EN.

Figure 7:
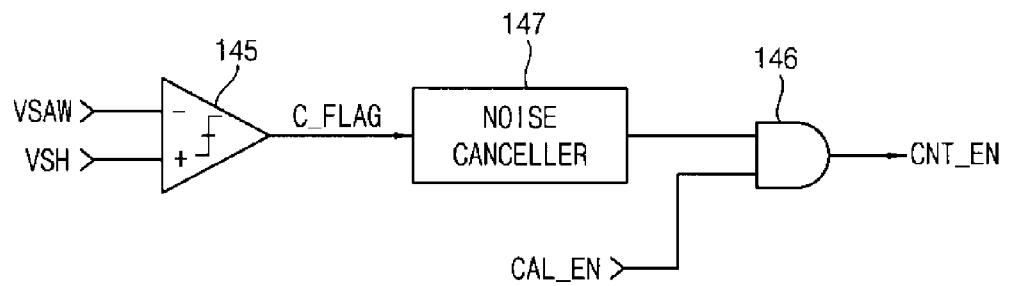
FIG. 7 is a circuit diagram illustrating another example of a feedback circuit included in the calibration circuit of FIG. 5 according to an embodiment of the present general inventive concept.

FIG. 7 is a circuit diagram illustrating another example of a feedback circuit 144b that may be included in the calibration circuit 140 of FIG. 5.

Referring to FIG. 7, the feedback circuit 144b includes a comparator 145, a noise canceller 147 and an AND gate 146.

The comparator 145 compares the sawtooth wave signal VSAW with the first reference voltage VSH to generate a flag signal C_FLAG. The noise canceller 147 cancels noise included in the flag signal C_FLAG. The AND gate 146 performs a logical AND operation on an output signal of the noise canceller 147 and the calibration enable signal CAL_EN to generate the counter enable signal CNT_EN.

Figure 8:
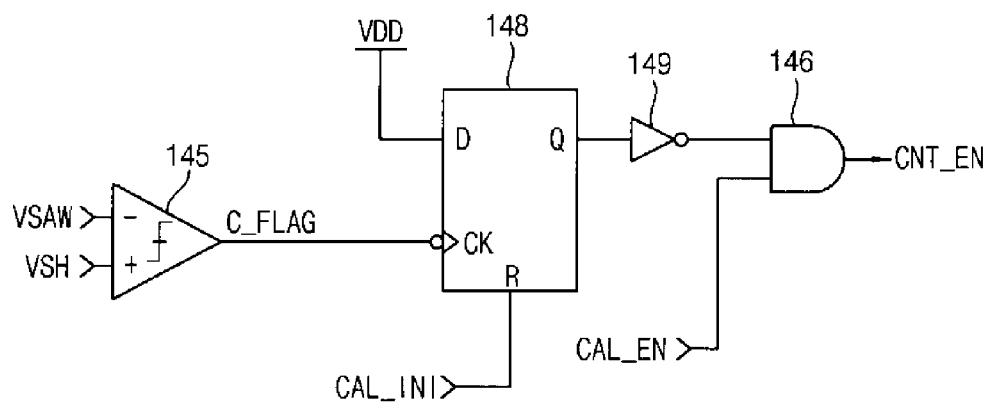
FIG. 8 is a circuit diagram illustrating still another example of a feedback circuit included in the calibration circuit of FIG. 5 according to an embodiment of the present general inventive concept.

FIG. 8 is a circuit diagram illustrating still another example of a feedback circuit 144c that may be included in the calibration circuit 140 of FIG. 5.

Referring to FIG. 8, the feedback circuit 144c includes a comparator 145, a D-type flip-flop 148, an inverter 149 and an AND gate 146.

The comparator 145 compares the sawtooth wave signal VSAW with the first reference voltage VSH to generate a flag signal C_FLAG. The D-type flip-flop 148 outputs a signal having a logical "high" state in response to the flag signal C_FLAG. The inverter 149 inverts a phase of an output signal of the D-type flip-flop 148. The AND gate 146 performs a logical AND operation on an output signal of the inverter 149 and the calibration enable signal CAL_EN to generate the counter enable signal CNT_EN. The D-type flip-flop 148 is reset by the calibration initializing signal CAL_INI that may also be used as an input signal to the counter 141.

Figure 9:
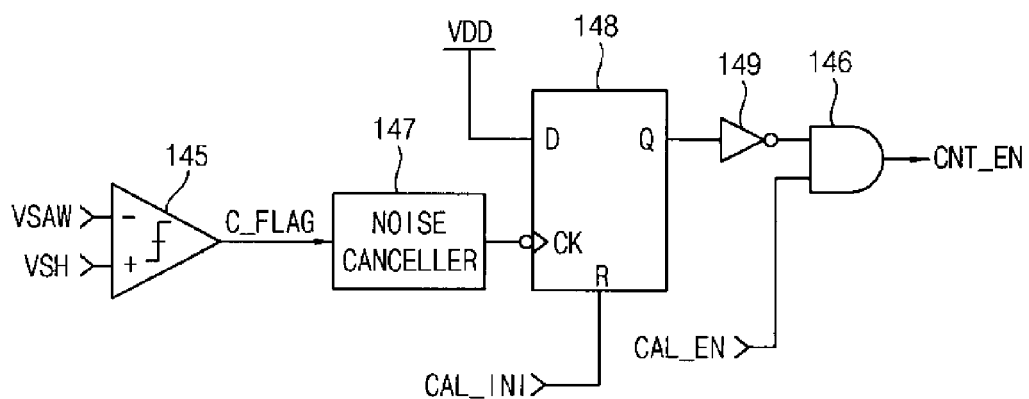
FIG. 9 is a circuit diagram illustrating still another example of a feedback circuit included in the calibration circuit of FIG. 5 according to an embodiment of the present general inventive concept.

FIG. 9 is a circuit diagram illustrating still another example of a feedback circuit 144d that may be included in the calibration circuit 140 of FIG. 5.

Referring to FIG. 9, the feedback circuit 144d includes a comparator 145, a noise canceller 147, a D-type flip-flop 148, an inverter 149 and an AND gate 146.

The comparator 145 compares the sawtooth wave signal VSAW with the first reference voltage VSH to generate a flag signal C_FLAG. The noise canceller 147 cancels noise included in the flag signal C_FLAG. The D-type flip-flop 148 outputs a signal having a logical "high" state in response to an output signal of the noise canceller 147. The inverter 149 inverts a phase of an output signal of the D-type flip-flop 148. The AND gate 146 performs a logical AND operation on an output signal of the inverter 149 and the calibration enable signal CAL_EN to generate the counter enable signal CNT_EN. The D-type flip-flop 148 is reset by the calibration initializing signal CAL_INI.

Figure 10:
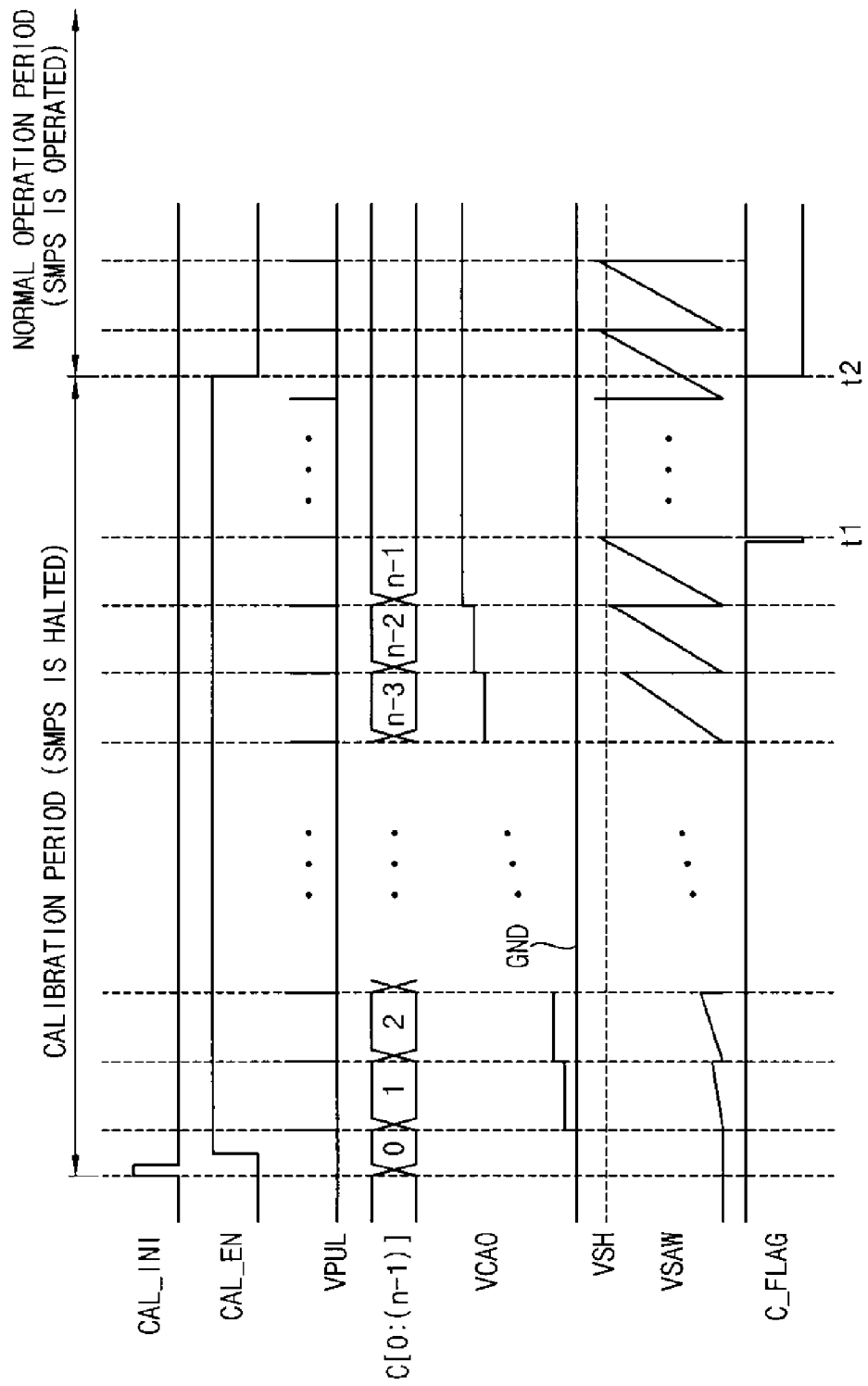
FIG. 10 is a timing diagram illustrating operation of the sawtooth wave generating circuit of FIG. 1 according to an embodiment of the present general inventive concept.

FIG. 10 is a timing diagram illustrating operation of the sawtooth wave generating circuit 100 of FIG. 1.

Hereinafter, the operation of the sawtooth wave generating circuit 100 will be described referring to FIG. 1 to FIG. 10.

Referring to FIG. 10, the sawtooth wave generating circuit 100 is initialized by the calibration initializing signal CAL_INI, and activated by the calibration enable signal CAL_EN. The short pulse signal VPUL is a signal having a predetermined period and a predetermined short pulse width.

In a calibration mode, i.e., during the calibration period before time t2, a magnitude of the sawtooth wave signal VSAW reaches the first reference voltage VSH at time t1. In the calibration mode, the magnitude of the sawtooth wave signal VSAW increases as the calibration output signal VCAO increases. In a normal mode, i.e. during the normal operation period after time t2, the calibration circuit 140 generates the calibration output signal VCAO having a value corresponding to the digital code C[0:(n-1)] which is stored in the calibration circuit 140. Therefore, in the normal mode, the sawtooth wave generating circuit 100 generates the sawtooth wave signal VSAW having a calibrated magnitude.

The digital code C[0:(n-1)] is maintained as C(n-1) after time t1, and the comparator 145 that is in the feedback circuit 144 generates the flag signal C_FLAG. The flag signal C_FLAG may be a signal that is enabled when the flag signal C_FLAG is at a logic "low" state, just before time t1.

As described above, the sawtooth wave generating circuit 100 according to example embodiments is applied to a device such as a Switch Mode Power Supply (SMPS) device after the calibration is performed through a feedback process. Therefore, even though a frequency, a fabrication process, an operating voltage, or an operating temperature may change, the sawtooth wave generating circuit 100 may provide an optimum charging current by performing calibration before the device such as SMPS device operates in a normal mode.

In the sawtooth wave generating circuit 100 according to example embodiments, the comparator 145 (illustrated in FIGS. 6-9) of the calibration circuit 140 that compares the sawtooth wave signal VSAW with the first reference voltage VSH to generate a flag signal C_FLAG may be shared with a comparator that compares an output signal of an error amplifier and the sawtooth wave signal VSAW to generate a switch control signal in the power conversion circuit of an SMPS device. Therefore, the sawtooth wave generating circuit 100 may calibrate the sawtooth wave signal VSAW more precisely.

Figure 11:
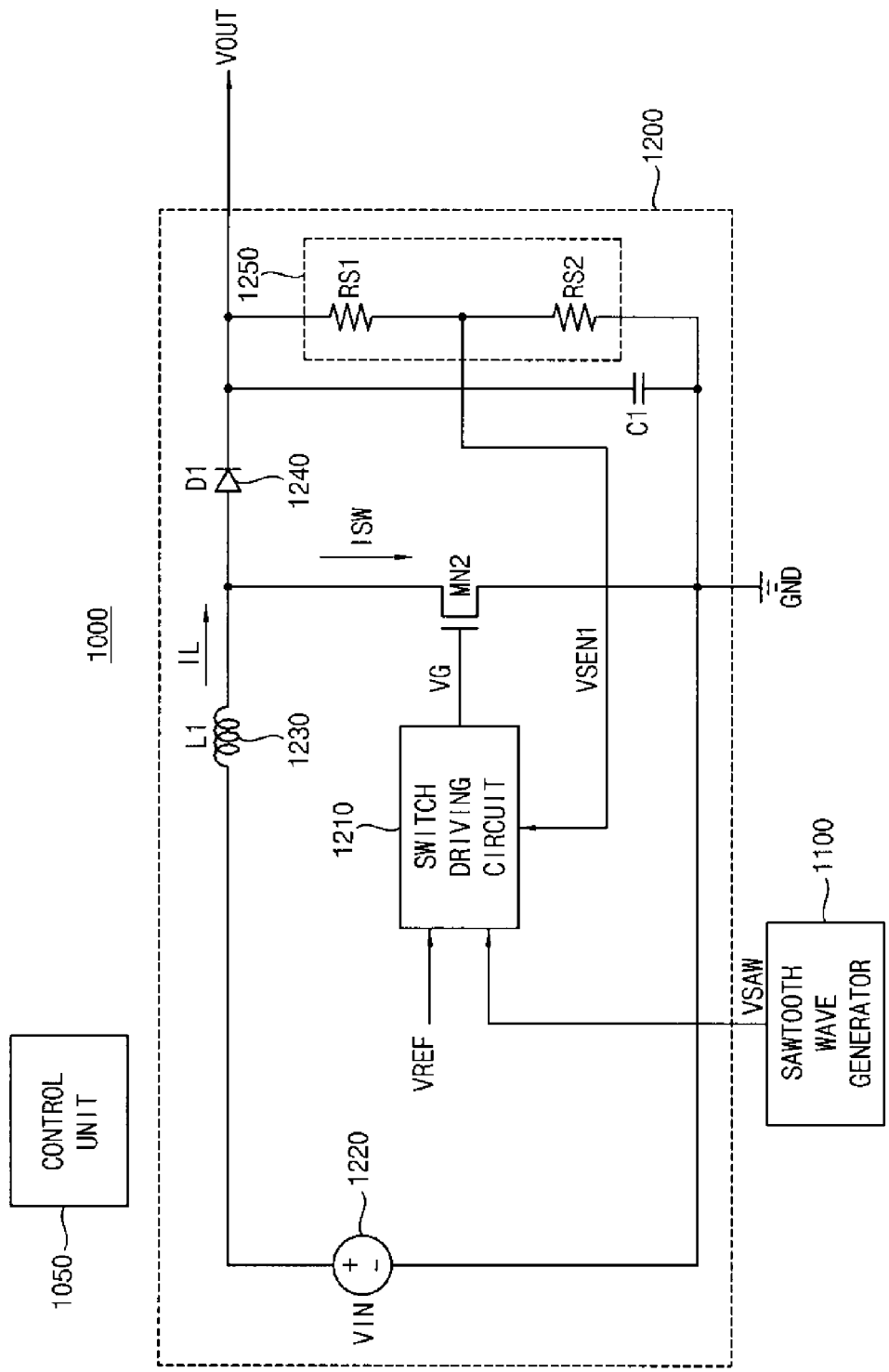
FIG. 11 is a circuit diagram illustrating an example of a DC-DC converter that includes the sawtooth wave generating circuit of FIG. 1 according to an embodiment of the present general inventive concept.

FIG. 11 is a circuit diagram illustrating an example of a DC-DC converter 1000 that includes the sawtooth wave generating circuit 100 of FIG. 1.

Referring to FIG. 11, the DC-DC converter 1000 includes a sawtooth wave generating circuit 1100, a power converting circuit 1200, and a control unit 1050. The sawtooth wave generating circuit 1100 may have the same structure as the structure of the sawtooth wave generating circuit 100 illustrated in FIG. 1.

The sawtooth wave generating circuit 1100, as described regarding FIG. 1, generates a sawtooth wave signal VSAW, feeds back the sawtooth wave signal VSAW to perform a calibration in a calibration mode, and operates in a normal mode when the sawtooth wave signal VSAW reaches a first reference voltage. The power converting circuit 1200, through a switch driving circuit 1210, generates a switch control signal VG using the sawtooth wave signal VSAW, changes an inductor current IL in response to the switch control signal VG, and converts a DC input voltage VIN into a stable DC output voltage VOUT.

The power converting circuit 1200 illustrated in FIG. 11 includes a switch driving circuit 1210, a DC voltage source 1220, an inductor (L1) 1230, and an NMOS transistor MN2. The NMOS transistor MN2 may be a power metal oxide semiconductor (power MOS) transistor or an insulated gate bipolar transistor (IGBT).

The DC voltage source 1220 generates the DC input voltage VIN. The switch driving circuit 1210 generates the switch control signal VG based on the sawtooth wave signal VSAW and inputs a first sensing voltage VSEN1 from a voltage divider 1250 and a reference voltage VREF from the control unit 1050. A first terminal of the inductor 1230 is connected to a first terminal of the DC voltage source 1220. A second terminal of the DC voltage source 1220 is connected to the ground GND. The NMOS transistor MN2 is coupled between a second terminal of the inductor 1230 and the ground GND, and operates in response to the switch control signal VG.

Further, the power converting circuit 1200 may include a diode (D1) 1240, a capacitor C1, and a voltage divider 1250.

The diode 1240 is coupled between the second terminal of the inductor 1230 and an output node. The capacitor C1 is coupled between the output node and the ground, and maintains the DC output voltage VOUT. The voltage divider 1250 divides a voltage of the output node to generate the first sensing voltage VSEN1.

The DC-DC converter 1000 illustrated in FIG. 11 generates the switch control signal VG using the sawtooth wave signal VSAW that is generated through a calibration process, changes the inductor current IL in response to the switch control signal VG, and converts the DC input voltage VIN into the stable DC output voltage VOUT. A switch current ISW flows through the NMOS transistor MN2 when the NMOS transistor MN2 is turned on, and the inductor current IL flows through the diode D1 and charges the capacitor C1 when the NMOS transistor MN2 is turned off. When the NMOS transistor MN2 repeatedly performs a switching operation in response to the switch control signal VG, the DC output voltage VOUT having larger value than the DC input voltage VIN may be generated.

The DC-DC converter 1000 illustrated in FIG. 11 may be a boost converter that generates a stable DC output voltage VOUT having larger value than the DC input voltage VIN. For example, the DC input voltage VIN may have a magnitude of 100V and the DC output voltage VOUT may have a magnitude of 300V. The booster converter may be used in the electronic ballast that drives a fluorescent lamp.

The inductor 1230 in the DC-DC converter 1000 illustrated in FIG. 11 may be a transformer having a primary side and secondary side, and the diode 1240, the capacitor C1 and the voltage divider 1250 may be coupled to the secondary side of the transformer.

Figure 12:
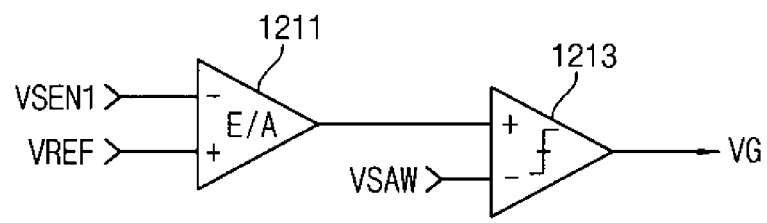
FIG. 12 is a circuit diagram illustrating an example of a switch driving circuit included in the DC-DC converter of FIG. 11 according to an embodiment of the present general inventive concept.
Figure 13:
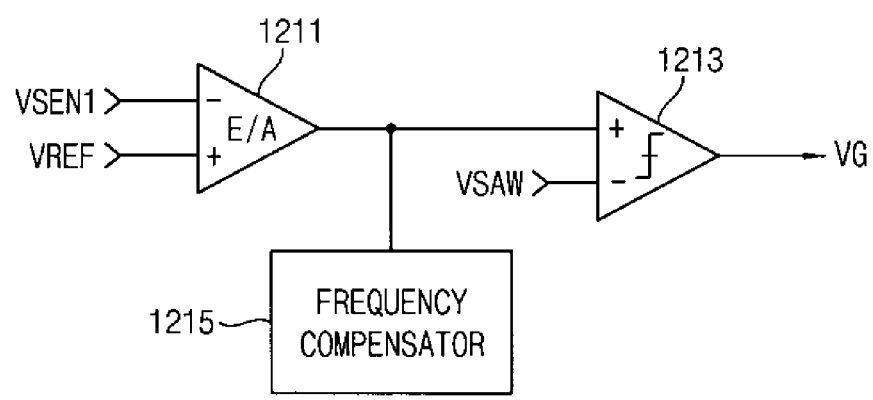
FIG. 13 is a circuit diagram illustrating another example of a switch driving circuit included in the DC-DC converter of FIG. 11 according to an embodiment of the present general inventive concept.
Figure 14:
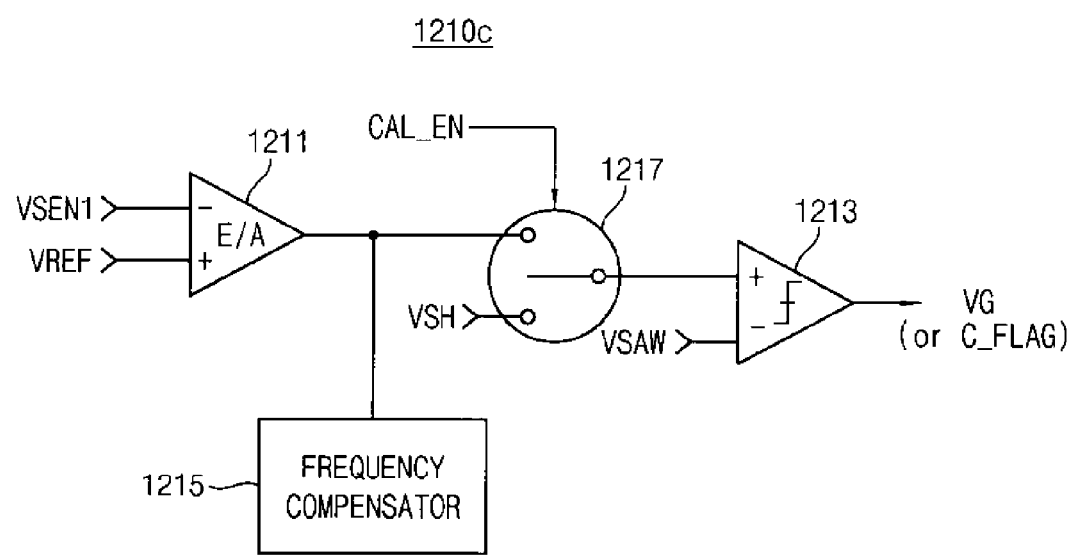
FIG. 14 is a circuit diagram illustrating still another example of a switch driving circuit included in the DC-DC converter of FIG. 11 according to an embodiment of the present general inventive concept.

FIGS. 12-14 are circuit diagrams illustrating examples of switch driving circuits 1210a, 1210b and 1210c included in the DC-DC converter 1000.

FIG. 12 is a circuit diagram illustrating an example of a switch driving circuit 1210a included in the DC-DC converter 1000 of FIG. 11.

Referring to FIG. 12, the switch driving circuit 1210a includes an error amplifier 1211 and a comparator 1213.

The error amplifier 1211 amplifies a difference between the first sensing voltage VSEN1 and a second reference voltage VREF. The comparator 1213 compares an output signal of the error amplifier 1211 and the sawtooth wave signal VSAW, to generate the switch control signal VG.

FIG. 13 is a circuit diagram illustrating another example of a switch driving circuit 1210b included in the DC-DC converter 1000 of FIG. 11.

Referring to FIG. 13, the switch driving circuit 1210b includes an error amplifier 1211, a frequency compensating circuit 1215 and a comparator 1213.

The error amplifier 1211 amplifies a difference between the first sensing voltage VSEN1 and a second reference voltage VREF. The frequency compensating circuit 1215 performs frequency compensation on an output signal of the error amplifier 1211. The comparator 1213 compares an output signal of the error amplifier 1211 and the sawtooth wave signal VSAW to generate the switch control signal VG.

FIG. 14 is a circuit diagram illustrating still another example of a switch driving circuit 1210c included in the DC-DC converter 1000 of FIG. 11.

Referring to FIG. 14, the switch driving circuit 1210c includes an error amplifier 1211, a switch 1217 and a comparator 1213.

The error amplifier 1211 amplifies a difference between the first sensing voltage VSEN1 and a second reference voltage VREF. The frequency compensating circuit 1215 performs frequency compensation on an output signal of the error amplifier 1211. The switch 1217 provides an output signal of the error amplifier 1211 or the first reference voltage VSH to a non-inverting terminal of the comparator 1213 in response to a calibration enable signal CAL_EN. The comparator 1213 compares the first reference voltage VSH and the sawtooth wave signal VSAW to generate the flag signal C_FLAG in a calibration mode, and compares an output signal of the error amplifier 1211 and the sawtooth wave signal VSAW to generate the switch control signal VG in a normal mode.

The comparator 1213 included in the switch driving circuit 1210c may be shared with a comparator that compares the sawtooth wave signal VSAW with the first reference voltage VSH to generate a flag signal C_FLAG. The switch driving circuit 1210c compares the first reference voltage VSH and the sawtooth wave signal VSAW to generate the flag signal C_FLAG in a calibration mode, and compares an output signal of the error amplifier 1211 and the sawtooth wave signal VSAW to generate the switch control signal VG in a normal mode because the switch driving circuit 1210c has the switch 1217 which switches either the VSH input signal or the CAL_EN input signal to be input to the comparator 1213.

In case that the switch driving circuit 1210c of FIG. 14 is used in the DC-DC converter 1000 illustrated in FIG. 11, the comparator 1213 in the switch driving circuit 1210c may be used as the comparator (e.g., 145 included in FIG. 6 to FIG. 9) in the sawtooth wave generating circuit 1100. Therefore, the DC-DC converter 1000 may calibrate the sawtooth wave signal VSAW more precisely.

Figure 15:
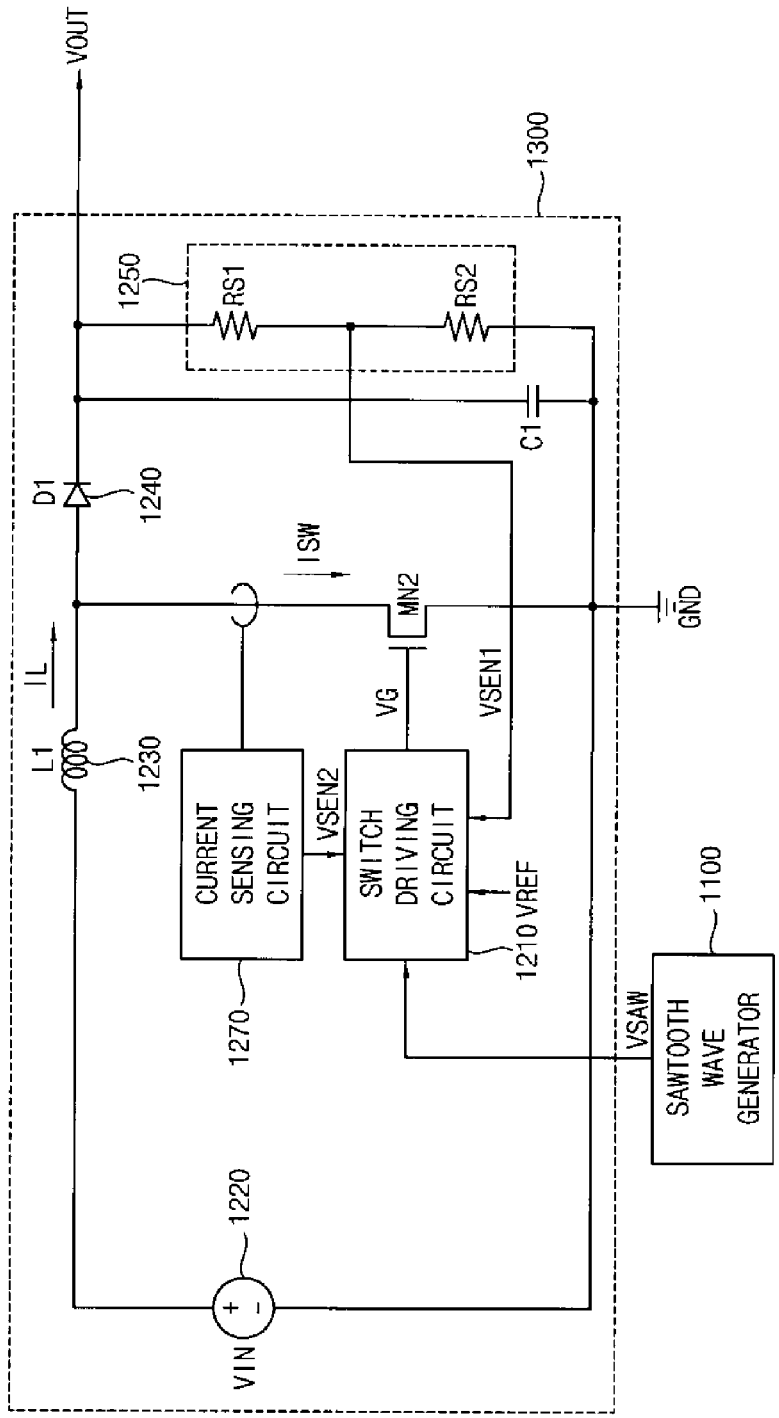
FIG. 15 is a circuit diagram illustrating another example of a DC-DC converter that includes the sawtooth wave generating circuit of FIG. 1 according to an embodiment of the present general inventive concept.

FIG. 15 is a circuit diagram illustrating another example of a DC-DC converter that includes the sawtooth wave generating circuit 100 of FIG. 1.

Referring to FIG. 15, the DC-DC converter 2000 includes a sawtooth wave generating circuit 1100, a power converting circuit 1300, and a control unit 1050. The sawtooth wave generating circuit 1100 may have the same structure as the structure of the sawtooth wave generating circuit 100 illustrated in FIG. 1.

The sawtooth wave generating circuit 1100 generates a sawtooth wave signal VSAW, feeds back the sawtooth wave signal VSAW to perform a calibration in a calibration mode, and operates in a normal mode after the sawtooth wave signal VSAW reaches a first reference voltage. The power converting circuit 1300 generates a switch control signal VG using the sawtooth wave signal VSAW, changes an inductor current IL in response to the switch control signal VG, and converts a DC input voltage VIN into a stable DC output voltage VOUT.

The power converting circuit 1300 also includes a switch driving circuit 1210, a DC voltage source 1220, an inductor (L1) 1230, a current sensing circuit 1270 and an NMOS transistor MN2. The NMOS transistor MN2 may be a power metal oxide semiconductor (power MOS) transistor or an insulated gate bipolar transistor (IGBT).

The DC voltage source 1220 generates the DC input voltage VIN. The switch driving circuit 1210 generates the switch control signal VG based on the sawtooth wave signal VSAW, a first sensing voltage VSEN1 and a reference voltage VREF. A first terminal of the inductor 1230 is connected to a first terminal of the DC voltage source 1220. A second terminal of the DC voltage source 1220 is connected to the ground GND. The NMOS transistor MN2 is coupled between a second terminal of the inductor 1230 and the ground GND, and operates in response to the switch control signal VG. The current sensing circuit 1270 senses a current ISW flowing through the NMOS transistor MN2 to generate a second sensing voltage VSEN2.

Further, the power converting circuit 1300 may include a diode (D1) 1240, a capacitor C1, and a voltage divider 1250.

The DC-DC converter 2000 illustrated in FIG. 15 generates the switch control signal VG from the switch driving circuit 1210, which is a pulse-width modulation (PWM) clock signal, using not only the first sensing voltage VSEN1 corresponding to the DC output voltage VOUT but also the second sensing voltage VSEN2 corresponding to the current ISW flowing through the NMOS transistor MN2, which is the inductor current IL while the diode 1240 is turned off. Therefore, the DC-DC converter 2000 may generate the DC output voltage VOUT more stably.

Figure 16:
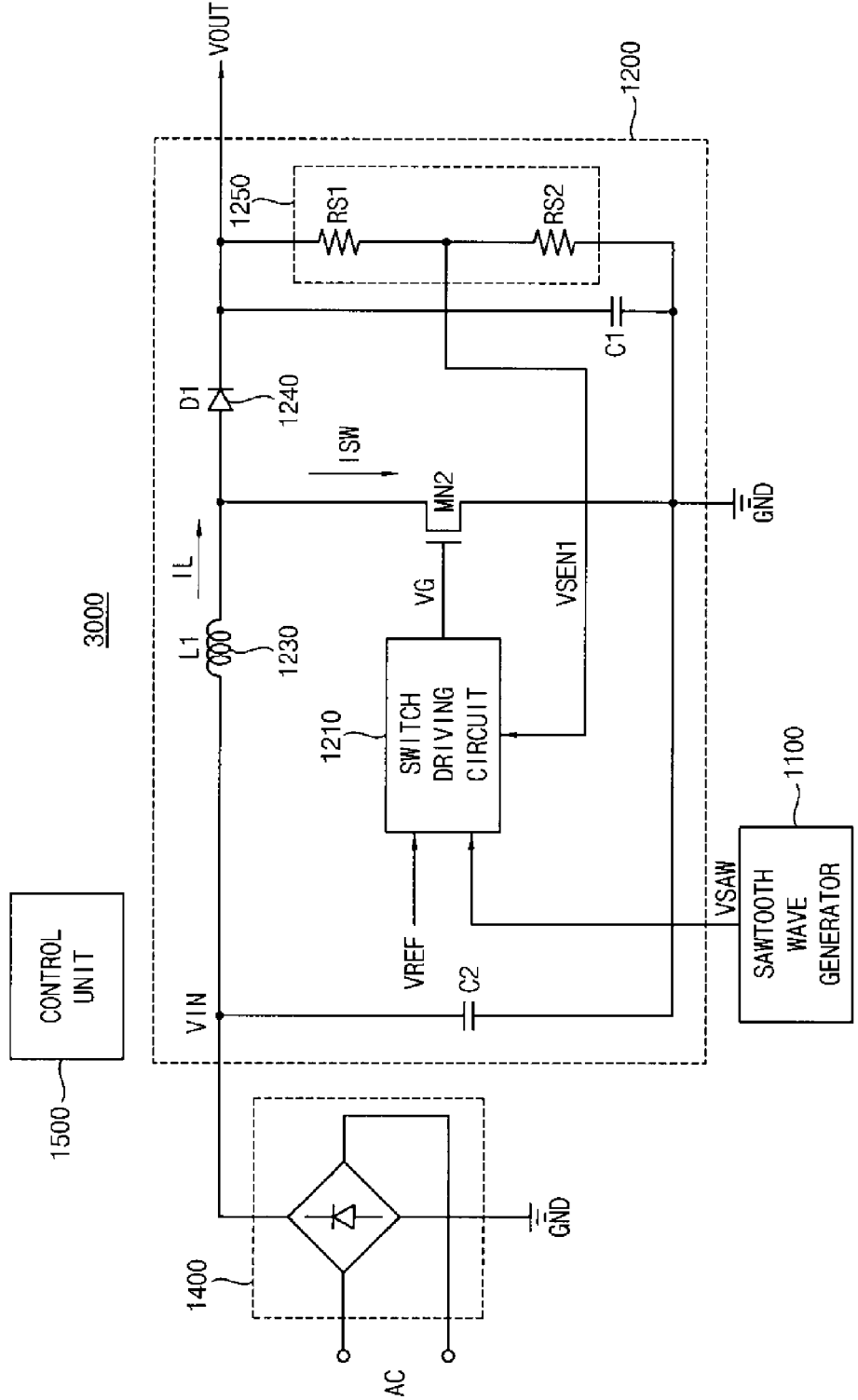
FIG. 16 is a circuit diagram illustrating an example of a switch mode power supply device that includes the sawtooth wave generating circuit of FIG. 1 according to an embodiment of the present general inventive concept.

FIG. 16 is a circuit diagram illustrating an example of a switch mode power supply device that includes the sawtooth wave generating circuit 100 of FIG. 1.

Referring to FIG. 16, the switch mode power supply device 3000 includes an AC-DC converter 1400, a sawtooth wave generating circuit 1100, a power converting circuit 1200, and a control unit 1500 to control the operations thereof.

The AC-DC converter 1400 converts an AC input voltage AC into a DC input voltage VIN. The AC-DC converter 1400 may include a full wave rectifier that converts the AC input voltage into the DC input voltage VIN and a noise filter that rejects noise that may be in an input line.

The sawtooth wave generating circuit 1100 generates a sawtooth wave signal VSAW, feeds back the sawtooth wave signal VSAW to perform a calibration in a calibration mode, and operates in a normal mode after the sawtooth wave signal VSAW reaches a first reference voltage.

The power converting circuit 1200 includes a switch driving circuit 1210, an inductor (L1) 1230, an NMOS transistor MN2, a diode 1240, a first capacitor C1 and a second capacitor C2.

The second capacitor C2 illustrated in FIG. 16 is corresponding to the DC voltage source 1220 illustrated in FIG. 11, and maintains the DC input voltage VIN. The operation of the power converting circuit 1200 is substantially the same as described above referring to FIG. 11.

The DC voltage source 1220 included in the DC-DC converter 1000 of FIG. 11 and the DC-DC converter 2000 of FIG. 15 correspond to the AC-DC converter 1400 and the second capacitor C2 illustrated in FIG. 16. That is, the DC input voltage VIN illustrated in FIG. 11 and FIG. 15 may be generated by the AC-DC converter 1400 and the second capacitor C2 illustrated in FIG. 16.

The DC-DC converter 1000 of FIG. 11 and the DC-DC converter 2000 of FIG. 15 may be regarded as a switch mode power supply (SMPS) device.

Referring to FIG. 1 to FIG. 10, a method of generating a sawtooth wave signal includes feeding back the sawtooth wave signal VSAW, generating a plurality of voltage signals V1, V2, . . . , V2n based on the sawtooth wave signal VSAW, selecting one of the voltage signals V1, V2, . . . , V2n to generate a calibration output signal VCAO, charging the capacitor CS in response to the calibration output signal VCAO, and discharging the capacitor CS in response to a short pulse signal VPUL.

In accordance with the method of generating a sawtooth wave signal according to example embodiments, calibration may be performed in a calibration mode, and the calibrated sawtooth signal may be provided after the sawtooth wave signal approaches a set reference voltage.

The operation of generating the plurality of voltage signals V1, V2, . . . , V2n includes comparing the sawtooth wave signal VSAW with a first reference voltage VSH to generate a counter enable signal CNT_EN, generating a digital code C[0:(n-1)] having n bits in response to the counter enable signal CNT_EN, and decoding the digital code C[0:(n-1)] having n bits to generate the voltage signals V1, V2, . . . , V2n.

In the above, a boost converter and a switch mode power converter including the boost converter is described, but the present general inventive concept may be applied to various types of converters including a Buck converter and a switch mode power supply device including the converters that may generate a stable DC output voltage. Particularly, the switch mode power supply device may be applied to a display device to provide the stable DC output voltage to a driver integrated circuit for driving a display panel.

While the example embodiments of the present general inventive concept and its advantages have been described in detail, it should be understood that various changes, substitutions and alterations can be made herein without departing from the scope of the present general inventive concept as defined by appended claims and their equivalents.

What is claimed is:

1. A sawtooth wave generating circuit comprising:
 a capacitor coupled between a first node and a ground;
 a calibration circuit configured to receive a sawtooth wave signal that is fed back from the first node, configured to generate a plurality of voltage signals based on the sawtooth wave signal and configured to select one of the voltage signals to generate a calibration output signal;
 a charging circuit configured to charge the capacitor in response to the calibration output signal; and
 a discharging circuit configured to discharge the capacitor in response to a short pulse signal,
 wherein the calibration circuit comprises:
  a feedback circuit configured to compare the sawtooth wave signal with a first reference voltage to generate a counter enable signal;
  a counter configured to generate a digital code having N bits in response to the counter enable signal;
  a decoder configured to decode the digital code having the N bits to generate the voltage signals; and
  a multiplexer configured to select one of the voltage signals to generate the calibration output signal.

2. The sawtooth wave generating circuit of claim 1, wherein the calibration circuit is configured to perform calibration based on the fed-back sawtooth wave signal in a calibration mode and configured to operate in a normal mode when the sawtooth wave signal approaches a set reference voltage.

3. The sawtooth wave generating circuit of claim 1, wherein the feedback circuit comprises:

a comparator configured to compare the sawtooth wave signal with the first reference voltage to generate a flag signal; and an AND gate configured to perform a logical AND operation on the flag signal and a calibration enable signal to generate the counter enable signal.

4. The sawtooth wave generating circuit of claim 1, wherein the feedback circuit comprises:

a comparator configured to compare the sawtooth wave signal with the first reference voltage to generate a flag signal;

a noise canceller configured to cancel noise included in the flag signal; and an AND gate configured to perform a logical AND operation on an output signal of the noise canceller and a calibration enable signal to generate the counter enable signal.

5. The sawtooth wave generating circuit of claim 1, wherein the feedback circuit comprises:

a comparator configured to compare the sawtooth wave signal with the first reference voltage to generate a flag signal;

a D-type flip-flop configured to output a signal having a logical high state in response to the flag signal;

an inverter configured to invert a phase of an output signal of the D-type flip-flop; and an AND gate configured to perform a logical AND operation on an output signal of the inverter and a calibration enable signal to generate the counter enable signal.

6. The sawtooth wave generating circuit of claim 1, wherein the feedback circuit comprises:

a comparator configured to compare the sawtooth wave signal with the first reference voltage to generate a flag signal;

a noise canceller configured to cancel noise included in the flag signal;

a D-type flip-flop configured to output a signal having a logical high state in response to an output signal of the noise canceller;

an inverter configured to invert a phase of an output signal of the D-type flip-flop; and an AND gate configured to perform a logical AND operation on an output signal of the inverter and a calibration enable signal to generate the counter enable signal.

7. The sawtooth wave generating circuit of claim 1, wherein the discharging circuit includes a transistor that discharges the first node to a logic low state.

8. A sawtooth wave generating circuit comprising:

a capacitor coupled between a first node and a ground;

a calibration circuit configured to receive a sawtooth wave signal that is fed back from the first node, configured to generate a plurality of voltage signals based on the sawtooth wave signal and configured to select one of the voltage signals to generate a calibration output signal;

a charging circuit configured to charge the capacitor in response to the calibration output signal, the charging circuit comprising an amplifier configured to amplify the calibration output signal, a current supplying circuit configured to supply a charging current in response to an output signal of the amplifier, and a resister configured to maintain the charging current; and a discharging circuit configured to discharge the capacitor in response to a short pulse signal, wherein the charging circuit comprises:

an amplifier configured to amplify the calibration output signal;

a current supplying circuit configured to supply a charging current in response to an output signal of the amplifier; and a resistor configured to maintain the charging current.

* * * * *